United States Patent
Goldstein et al.

(10) Patent No.: US 6,894,833 B2
(45) Date of Patent: May 17, 2005

(54) SEMICONDUCTOR OPTICAL AMPLIFIER

(75) Inventors: Léon Goldstein, Chaville (FR);
Jean-Yves Emery, Palaiseau (FR);
Frédéric Pommereau, Lardy (FR)

(73) Assignee: Avanex Corporation, Fremont, CA (US)

( * ) Notice: Subject to any disclaimer, the term of this patent is extended or adjusted under 35 U.S.C. 154(b) by 105 days.

(21) Appl. No.: 10/110,131

(22) PCT Filed: Aug. 20, 2001

(86) PCT No.: PCT/FR01/02631
§ 371 (c)(1),
(2), (4) Date: Apr. 9, 2002

(87) PCT Pub. No.: WO02/17453
PCT Pub. Date: Feb. 28, 2002

(65) Prior Publication Data
US 2002/0149073 A1 Oct. 17, 2002

(30) Foreign Application Priority Data
Aug. 22, 2000 (FR) .......................... 00 10820

(51) Int. Cl.$^7$ ............................. H01S 3/00
(52) U.S. Cl. ................................ 359/344
(58) Field of Search ................ 372/43–50; 359/344

(56) References Cited

U.S. PATENT DOCUMENTS

| | | | | |
|---|---|---|---|---|
| 5,151,818 A | * | 9/1992 | Thijs et al. | 359/344 |
| 5,394,423 A | | 2/1995 | Kasahara | 372/45 |
| 5,790,302 A | * | 8/1998 | Tiemeijer | 359/344 |
| 5,982,531 A | | 11/1999 | Emery et al. | 359/344 |
| 6,487,007 B1 | * | 11/2002 | Morito | 359/344 |

FOREIGN PATENT DOCUMENTS

| | | | | |
|---|---|---|---|---|
| EP | 0 935 321 A1 | 8/1999 | | H01S/3/18 |
| JP | 11-330630 A | 2/2000 | | H01S/3/18 |

\* cited by examiner

*Primary Examiner*—Nelson Moskowitz
*Assistant Examiner*—Deandra M. Hughes
(74) *Attorney, Agent, or Firm*—Moser, Patterson & Sheridan, L.L.P.

(57) ABSTRACT

The invention relates to a semiconductor optical amplifier including a buried guide active structure (12), characterized in that the guide active structure (12) is subjected to an external stress to render the gain of said amplifier insensitive to the polarization of the light to be amplified, said external stress coming from a force induced by a deposit of a material (50) against a ridge (15) surrounding said guide active structure (12).

16 Claims, 2 Drawing Sheets

SEMICONDUCTOR OPTICAL AMPLIFIER

CROSS REFERENCE TO RELATED APPLICATIONS

This application claims benefit of International Application No. PCT/FR01/02631, filed on Aug. 20, 2001, and claims priority of France Application No. 00/10820, filed Aug. 22, 2000. The aforementioned applications are herein incorporated by reference in their entirety.

The present invention relates to amplifying optical signals. It finds a typical application in fiber optic telecommunication networks. The signals transmitted by fiber optic telecommunication networks consist of pulses carrying information to be transmitted in binary form. The pulses must be amplified to compensate power losses that they suffer during their propagation in said networks. Semiconductor amplifiers constitute a compact means of obtaining such amplification and can be integrated. However, unless specific measures are implemented to prevent it, their gain is sensitive to the state of polarization of the light that they receive, as indicated more simply hereinafter by referring to the polarization-sensitivity of an amplifier.

The invention finds a particular application when it is necessary to eliminate or at least limit polarization-sensitivity, which can be expressed by the following equation: $\Delta G = G_{TE} - G_{TM}$. The aim is to achieve the condition $|\Delta G| < 1$ dB.

The situation in which the sensitivity must be limited or eliminated is frequently encountered and arises when the distance traveled by the optical pulses to be amplified is such that the state of polarization of the pulses has been significantly and randomly affected during their propagation and it is preferable for the amplified pulses to have one or more predetermined power levels.

More generally, the invention finds an application whenever an optical amplifier must have no polarization-sensitivity or a low polarization-sensitivity.

The invention applies more specifically to buried ridge structure (BRS) amplifiers.

A buried ridge structure semiconductor optical amplifier (see FIG. 1) includes a wafer 2 made up of layers of semiconductor materials having respective refractive indices and forming a common crystal lattice. In the absence of mechanical stresses, the lattices formed by these materials have respective characteristic dimensions constituting respective lattice parameters of the materials. The layers are in succession in a vertical direction DV forming a right-angle trihedron, defined with respect to the wafer 2, with two horizontal directions constituting a longitudinal direction DL and a transverse direction DT. The layers form an upward succession in the vertical direction DV from a bottom face 4 to a top face 6. The wafer 2 includes at least the following layers or groups of layers or parts of layers:

A substrate 8 consisting mainly of a semiconductor basic material having a first type of conductivity. This substrate is sufficiently thick to impose the dimensions of the lattice of the basic material on all of the crystal lattice of the wafer 2.

An active layer 10 including an active material adapted to amplify light by stimulated recombination of charge carriers of both types injected into the material.

A buried guide active structure 12 formed in the active layer 10 and having a higher refractive index than the surrounding materials 14, 16. The active structure 12 extends in the longitudinal direction DL to guide light in that direction and has a transverse width $l$ and a vertical thickness $e$.

Finally, a top confinement layer 18 consisting of a material having a second type of conductivity which is the opposite of the first type.

The amplifier further includes a bottom electrode 20 and a top electrode 22 respectively formed on the bottom face 4 and the top face 6 of the wafer 2 to enable an electrical current to flow between said faces for injecting said charge carriers of both types into the active material 10.

The basic material of prior art semiconductor optical amplifiers are III–V materials, typically indium phosphide and gallium arsenide. The active material is typically a ternary or quaternary material containing the same chemical elements. It is generally required for the width $l$ of the guide active structure 12 which guides the light to be close to one micrometer, to facilitate etching it and most importantly to facilitate integrating the amplifier with other optical components on the same semiconductor wafer. To ensure monomode propagation of light, typically at a wavelength of 1 310 nm or 1 550 nm, the thickness $e$ must then be very much less than the width $l$. If no special measures are applied to prevent it, this rectangular shape of the section of the guide active structure 12 causes the polarization-sensitivity previously mentioned.

In BRS amplifiers, the active material 10 constituting the active structure 12 guiding the light is surrounded on all sides by a binary semiconductor material. This material has the advantage of conducting heat well, but its refractive index is only slightly lower than that of the active material. Consider further the situation in which the active material is homogeneous, in which case it is referred to as a bulk material. As a general rule, the section of the buried guide active structure 12 is strongly rectangular. Given the small index difference between the guide structure 12 and the surrounding binary material, the confinement of a horizontally polarized wave is greater than that of a vertically polarized wave, the difference between the two confinement factors increasing as the ratio of the width $l$ to the thickness $e$ of the guide structure 12 increases. The confinement referred to above in connection with a wave is in a transverse plane. It is equal to the ratio of the power of the wave in the area occupied by the guide structure to the total power of the wave. The confinement factor is defined for each polarization and for each wavelength by the shape and dimensions of the section of the guide active structure 12 and by the refractive indices of the material of the structure 12 and the surrounding materials 14, 16, 8 and 18. In the case of a rectangular section, it can be considered to be the product of a directional confinement factor in the horizontal direction by a directional confinement factor in the vertical direction, each of the two directional confinement factors depending on the polarization. Given that the phenomenon of amplification of the wave by recombination of carriers and stimulated emission occurs only in the active material, i.e. in the structure 12, the gain of the amplifier for a wave increases as the confinement of the wave increases. As a result of this, if the material of the guide structure 12 were a homogeneous material, and also isotropic, and therefore insensitive to polarization, the gain of the amplifier would be greater for horizontally polarized waves than for vertically polarized waves.

Considerable research has been conducted into making these amplifiers insensitive to the polarization of the light to be amplified.

In particular, U.S. Pat. No. 5,982,531 proposes an amplifier of this kind that is rendered insensitive to the polarization of the light. The amplifier is characterized in that its active material 10 is subjected to a sufficient tension stress to render its gain insensitive to the polarization of the light to be amplified. This stress generally results from a lattice mismatch between the active material 10 and the basic material of the substrate 8. The horizontal confinement factor is typically equal to the product of the vertical confinement factor by a confinement dissymmetry coefficient.

The present invention is based on the observation that, even in the presence of a high confinement dissymmetry coefficient resulting, for example, from the fact that the guide structure 12 consists of a ridge of strongly rectangular section, the tension stress to be applied to a homogeneous active material forming said structure to obtain insensitivity to polarization is sufficiently low for the thickness of the structure to remain less than the corresponding critical thickness relating to dislocations.

The above kind of amplifier has a low sensitivity to polarization. Its main parameters are:

the wavelength of the amplifying active layer: $\lambda = 1.57\,\mu m$, the active material: $In_{1-x}Ga_xP_{1-y}As_y$, the tension stress of the active layer: $\Delta a/a = -0.015$, the thickness of the guide structure: $e = 0.2\,\mu m$, and the width of the guide structure: $l = 1\,\mu m$.

This kind of structure has drawbacks, however. It has been established experimentally and theoretically that the polarization depends strongly on the control of the thickness of the active layer and the stresses to which it is subjected. For example, modifying this stress ($\Delta a/a$) from $-0.015$ to $-0.014$ or $-0.016$ induces a gain shift $\Delta G$ of 0.8 dB toward a respective sensitivity of the TE mode or the TM mode. Similarly, a slight modification of the thickness of the guide active structure (of a few percent) directly induces a gain offset $\Delta G$ of the amplifier. Accordingly the sensitivity of the amplifier to the polarization of the light depends on its structure and cannot be controlled easily.

The object of the present invention is to remove the drawbacks of the technology proposed by the previously cited U.S. Pat. No. 5,982,531.

The invention begins from the theoretical and experimental finding that the sensitivity of a semiconductor optical amplifier to the polarization of the light to be amplified depends not only on the geometry of the guide active structure and internal stresses to which it may be subjected (such as a lattice mismatch), but also on external stresses applied to the guide active structure, for example during implementation or use of the optical component.

To this end, the invention proposes to apply to the amplifier component an external stress induced in the vicinity of the guide active structure, alone or in combination with an internal tension stress, depending on the epitaxial structure of the active layer, as developed in the prior art. The external stress can have its parameters set to obtain an overall stress on the guide active structure that renders the gain of the optical amplifier insensitive to the polarization of the light to be amplified.

The invention relates more particularly to a semiconductor optical amplifier including a buried guide active structure, characterized in that the guide active structure is subjected to an external stress to render the gain of said amplifier insensitive to the polarization of the light to be amplified, said external stress coming from a force induced by a deposit of a material against a ridge surrounding said guide active structure.

According to one feature, the ridge surrounding the guide active structure has a depth from 1 $\mu m$ to 4 $\mu m$.

According to another feature, the ridge surrounding the guide active structure has a width from 4 $\mu m$ to 6 $\mu m$.

According to another feature, the material deposited against the ridge surrounding the active structure is an oxide.

In one embodiment, the material deposited is $SiO_2$ for an external compression stress.

In another embodiment, the material deposited is $Si_3N_4$ for an external tension stress.

According to one feature, the thickness of the material deposited against the ridge surrounding the active structure is from 0.1 $\mu m$ to 0.5 $\mu m$.

In one application, the guide active structure is subjected to an internal stress due to a lattice mismatch of the semiconductor material, the external stress being a stress additional to this internal stress.

The invention also relates to a method of manufacturing a semiconductor optical amplifier, characterized in that it includes the following steps:

producing a semiconductor optical amplifier with a buried guide active structure, etching a ridge surrounding said guide active structure, depositing an oxide on the contours of the etched ridge, and forming an electrode.

The optical amplifier according to the invention achieves a sensitivity to the polarization of the light less than or equal to 1 dB.

The ridge surrounding the guide active structure can be etched at the end of the process of fabricating the optical amplifier, using techniques that are known in the art and easy to use.

Other features and advantages of the present invention will become apparent in the course of the following description, which is given by way of non-limiting illustrative example and with reference to the drawings, in which:

FIG. 1, already described, is a diagram of a prior art buried ridge structure semiconductor optical amplifier.

Figure 2:
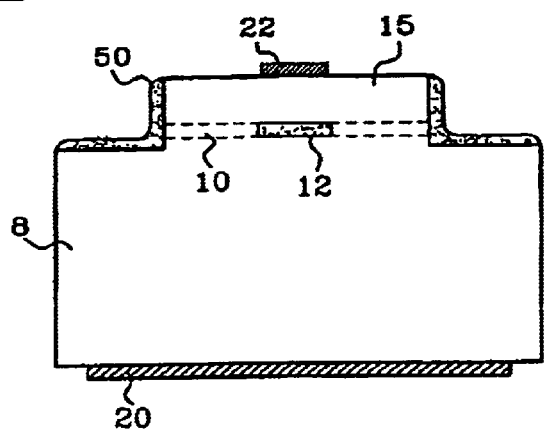
FIG. 2 is a diagram of a semiconductor optical amplifier in accordance with the invention subjected to an external stress.

The following description refers to FIG. 2 and to FIGS. 3a to 3d.

Figure 1:
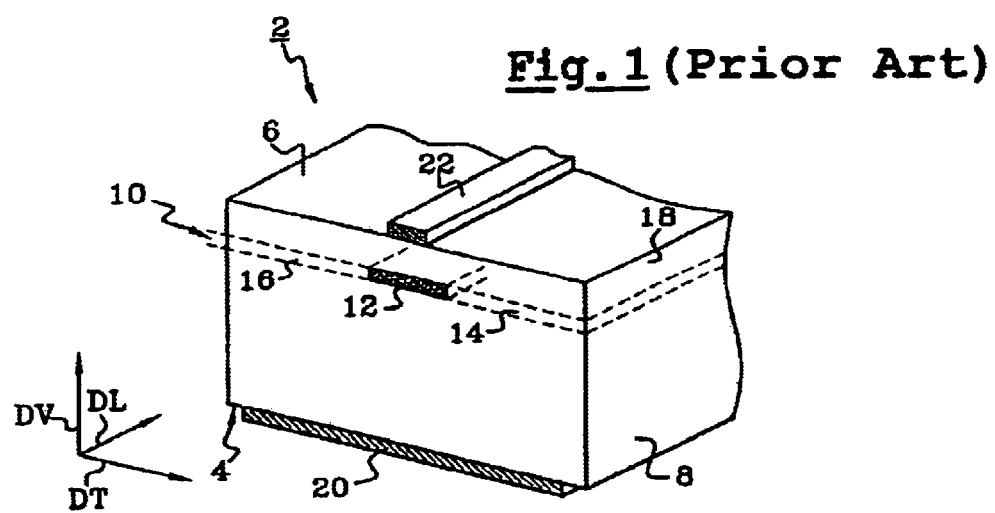

An optical amplifier according to the invention has a structure analogous to that described in connection with the prior art with reference to FIG. 1. The same reference numbers are used to designate the same components. The method of fabricating this kind of amplifier therefore includes the same steps, producing an amplifier with a buried guide active structure 12.

In a first application, the guide active structure 12 can be subjected to an internal stress due to a lattice mismatch of the semiconductor material, as described with reference to U.S. Pat. No. 5,982,531. The invention then consists in completing or compensating that internal stress by applying an external stress to the guide active structure 12 so that it is subjected to an overall stress that renders the gain of the amplifier insensitive to the polarization of the light to be amplified.

In another application, no internal stress is applied to the guide active structure 12 during epitaxial growth of the active layer 10, and the invention then consists of applying an external stress to the guide active structure 12 so that it is subjected to an overall stress that renders the gain of the amplifier insensitive to the polarization of the light to be amplified.

In either case, the external stress comes from a force induced by depositing a material 50 against a ridge 15 surrounding the guide active structure 12.

The ridge 15 surrounding the guide active structure 12 is etched by any technique known in the art, for example by dry etching through a mask 17 deposited on the confinement layer 18 of the amplifier, for example an $SiO_2$ mask.

The ridge 15 preferably has a depth from 1 μm to 4 μm and a width from 4 μm to 6 μm.

As a general rule, the buried guide active structure 12 has a width of approximately 2 μm and is at a depth from the top face 6 of the component from 2 μm to 4 μm (for a component approximately 100 μm thick including the substrate 8). The ridge 15 therefore surrounds the guide active structure 12 and the forces exerted on the ridge 15 are transmitted to the active structure 12 to influence the overall gain of the amplifier and its sensitivity to the polarization of the light to be amplified.

Figure 3A:
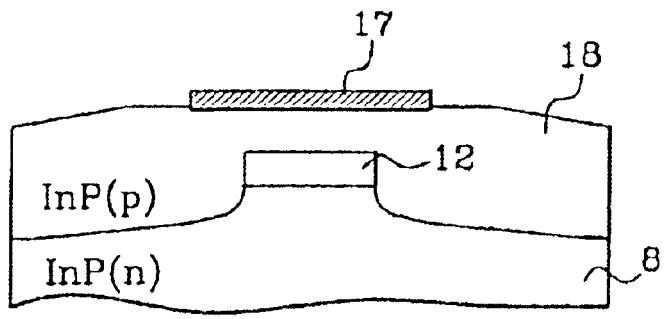
FIGS. 3a to 3d show diagrammatically steps in the production of an optical amplifier according to the invention.
Figure 3B:
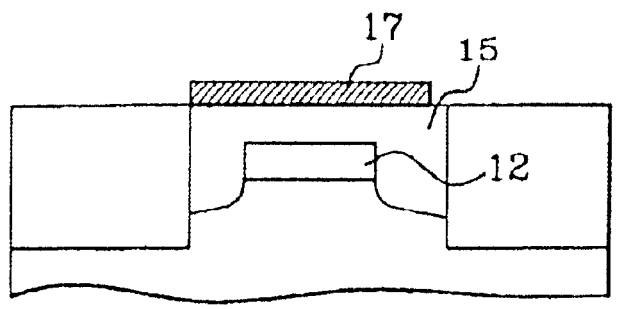
Figure 3C:
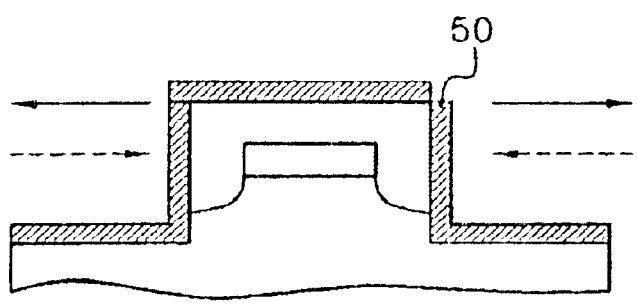
Figure 3D:
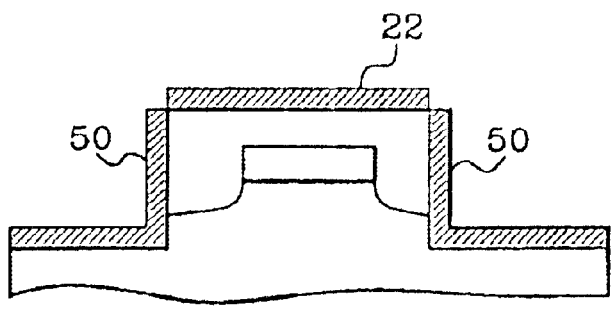

The material 50 deposited against the ridge 15 surrounding the active structure 12 is preferably an oxide, for example $SiO_2$ for an external compression stress (dashed line in FIG. 3c) or $Si_3N_4$ for an external tension stress (solid line in FIG. 3c). The thickness of the material 50 is advantageously from 0.1 μm to 0.5 μm.

The parameters for adjusting the external stress on the ridge 15 surrounding the guide active structure 12 of the amplifier are essentially the width and the depth of etching of the ridge 15, the nature of the material 50 deposited, and its thickness.

An electrode 22 is then formed on the top face 6 of the optical component, for example by forming an opening in the oxide deposit 50 on top of the active structure 12 to deposit metallization therein.

The metallization can be deposited on the opening of the electrode 22 and on top of the external stress material 50.

What is claimed is:

1. A semiconductor optical amplifier comprising:

a buried guide active structure (12);

a material (50); and a ridge; wherein the buried guide active structure is characterized in that the guide active structure (12) is subjected to an external stress to render the gain of said amplifier insensitive to the polarization of the light to be amplified, said external stress coming from a force induced by a deposit of the material (50) against the ridge (15) surrounding said guide active structure (12).

2. The optical amplifier according to claim 1, wherein the ridge (15) surrounding the guide active structure (12) has a depth from 1 μm to 4 μm.

3. The optical amplifier according to claim 1, wherein the ridge (15) surrounding the guide active structure (12) has a width from 4 μm to 6 μm.

4. The optical amplifier according to claim 1, wherein the material (50) deposited against the ridge (15) surrounding the active structure (12) is an oxide.

5. The optical amplifier according to claim 1, wherein the material (50) deposited is $SiO_2$ for an external compression stress.

6. The optical amplifier according to claim 1, wherein the material (50) deposited is $Si_3N_4$ for an external tension stress.

7. The optical amplifier according to claim 1, wherein the thickness of the material (50) deposited against the ridge (15) surrounding the active structure (12) is from 0.1 μm to 0.5 μm.

8. The optical amplifier according claim 1, wherein the guide active structure (12) is subjected to an internal stress due to a lattice mismatch of the semiconductor material, the external stress being a stress additional to this internal stress.

9. A method of manufacturing a semiconductor optical amplifier, comprising:

producing a semiconductor optical amplifier with a buried guide active structure (12);

etching a ridge (15) surrounding said guide active structure (12); and depositing an oxide (50) on the contours of the etched ridge (15), and forming an electrode (22); wherein the buried guide active structure is characterized in that the guide active structure (12) is subjected to an external stress to render the gain of said semiconductor optical amplifier insensitive to the polarization of the light to be amplified, said external stress coming from a force induced by a deposit of the material (50) against the ridge (15) surrounding said guide active structure (12).

10. The method of claim 9, wherein the ridge (15) surrounding the guide active structure (12) has a depth from 1 μm to 4 μm.

11. The method of claim 9, wherein the ridge (15) surrounding the guide active structure (12) has a width from 4 μm to 6 μm.

12. The method of claim 9, wherein the material (50) deposited against the ridge (15) surrounding the active structure (12) is an oxide.

13. The method of claim 9, wherein the material (50) deposited is $SiO_2$ for an external compression stress.

14. The method of claim 9, wherein the material (50) deposited is $Si_3N_4$ for an external tension stress.

15. The method of claim 9, wherein the thickness of the material (50) deposited against the ridge (15) surrounding the active structure (12) is from 0.1 μm to 0.5 μm.

16. The method of claim 9, wherein the guide active structure (12) is subjected to an internal stress due to a lattice mismatch of the semiconductor material, the external stress being a stress additional to this internal stress.

* * * * *